United States Patent [19]

Kinsbron et al.

[11] Patent Number: 4,471,524

[45] Date of Patent: Sep. 18, 1984

[54] METHOD FOR MANUFACTURING AN INSULATED GATE FIELD EFFECT TRANSISTOR DEVICE

[75] Inventors: Eliezer Kinsbron, Highland Park; William T. Lynch, Summit, both of N.J.

[73] Assignee: AT&T Bell Laboratories, Murray Hill, N.J.

[21] Appl. No.: 564,368

[22] Filed: Dec. 23, 1983

Related U.S. Application Data

[63] Continuation of Ser. No. 383,794, Jun. 1, 1982, abandoned.

[51] Int. Cl.³ .......................................... H01L 21/225
[52] U.S. Cl. .......................................... 29/571; 29/578; 29/591; 148/187; 148/188; 156/646; 204/192 EC
[58] Field of Search ................ 148/187, 188; 29/571, 29/578, 591; 156/646; 204/192 EC

[56] References Cited

U.S. PATENT DOCUMENTS

| | | | |
|---|---|---|---|
| 2,953,486 | 9/1960 | Atalla | 148/1.5 |
| 3,418,180 | 12/1968 | Ku | 148/187 |
| 3,617,824 | 11/1971 | Shinoda et al. | 148/187 X |
| 3,664,896 | 5/1972 | Duncan | 148/187 |
| 3,724,065 | 4/1973 | Carbajal et al. | 29/571 |
| 3,798,752 | 3/1974 | Fujimoto | 29/571 |
| 3,808,060 | 4/1974 | Hays et al. | 148/187 |
| 3,928,095 | 12/1975 | Harigaya et al. | 148/188 |
| 4,063,967 | 12/1977 | Graul et al. | 148/1.5 |
| 4,182,023 | 1/1980 | Cohen et al. | 29/571 |
| 4,274,892 | 6/1981 | Templin | 148/188 |
| 4,319,395 | 3/1982 | Lund et al. | 29/571 |
| 4,343,677 | 8/1982 | Kinsbron et al. | 156/643 |
| 4,354,309 | 10/1982 | Gardiner et al. | 29/571 |
| 4,355,454 | 10/1982 | Tasch, Jr. et al. | 29/571 |
| 4,356,040 | 10/1982 | Fu et al. | 29/578 X |
| 4,356,210 | 10/1982 | Imai et al. | 204/192 EC |
| 4,389,255 | 6/1983 | Chen et al. | 148/187 X |

Primary Examiner—G. Ozaki
Attorney, Agent, or Firm—Lucian C. Canepa

[57] ABSTRACT

An overall method for manufacturing an IGFET device having extremely shallow source and drain regions and reduced gate to source and drain overlap capacitances is disclosed. For silicon MOS devices, the method also provides for the formation of metal silicide layers on polysilicon gate electrodes and interconnection paths and the source and drain regions in the same fabrication step. Source and drain regions are formed by oxidation of an arsenic doped polysilicon source layer formed to be in contact with areas in the silicon surface in which such regions are to be formed. The rate of oxidation of the source layer exceeds the rate at which arsenic diffuses in the silicon at the oxidation temperature. Owing to a high segregation coefficient of arsenic in silicon dioxide, nearly all of the arsenic in the source layer is driven into extremely shallow source and drain regions which acquire high surface concentrations.

18 Claims, 3 Drawing Figures

FIG. 1

STEP 1
FORM FIELD OXIDE

STEP 2
DEFINE TRANSISTOR AREA

STEP 3
FORM GATE OXIDE

STEP 4
FORM POLYSILICON LAYER

STEP 5
PATTERN POLYSILICON LAYER

STEP 9
REMOVE OXIDE (ANISOTROPIC RSE OF OXIDE LAYER)
$CH_3 + NH_3$

STEP 10
FORM COBALT LAYER

STEP 11
SINTER, REMOVE UNREACTED COBALT

STEP 12 & 13
DEPOSIT P-GLASS, PLANARIZE, FORM AND DEFINE METAL LAYER

METHOD FOR MANUFACTURING AN INSULATED GATE FIELD EFFECT TRANSISTOR DEVICE

This application is a continuation of application Ser. No. 383,794, filed June 1, 1982 and now abandoned.

CROSS-REFERENCE TO RELATED APPLICATIONS

This application is related to copending U.S. applications Ser. No. 328,368 (E. Kinsbron and W. T. Lynch) filed on Dec. 7, 1981, now U.S. Pat. No. 4,432,132 and Ser. No. 352,519 (E. Kinsbron), filed on Feb. 26, 1982, abandoned in favor of Ser. No. 558,996, both assigned to the same assignee as the instant application.

BACKGROUND OF THE INVENTION

This invention relates to the manufacture of semiconductor devices, and more particularly to a method for manufacturing insulated gate field effect transistor devices having extremely shallow source and drain regions and reduced overlap capacitances between the gate and the source and drain regions.

In the manufacture of insulated-gate field-effect transistor (hereinafter referred to as IGFET) devices, such as integrated circuits, it is generally desirable to reduce the conduction channel lengths of the IGFETs for the purpose of increasing the packing density and operating speed of the device. It is also generally desirable, from the standpoint of increasing device speed, to reduce the gate to source and drain overlap capacitances of the IGFETs and to provide the device with lower resistance interconnections. Recent advances in lithographic and etching techniques have made it possible to form IGFETs having channel lengths of less than 1 $\mu$m. However, in order to avoid undesirable short channel effects, such as threshold voltage falloff, in such submicron channel length IGFETs, the source and drain regions of the IGFETs must be made extremely shallow. For example, in a silicon N-channel metal-oxide-semiconductor (MOS) transistor having an effective channel length of 0.5 $\mu$m, a gate oxide thickness of 250 Angstroms and a net channel doping concentration of $4 \times 10^{16}$ cm$^{-3}$, short channel effects are substantially avoided if the depths of the source and drain regions extend less than 1000 Angstroms below the surface of the channel. Furthermore, the sheet resistance of the source and drain regions of such a transistor must be relatively low (e.g., less than 70 ohms per square) so as not to reduce the current conduction capability of the transistor. Therefore, the fabrication of submicron channel length IGFETs requires the formation of source and drain regions which are extremely shallow and which have low sheet resistances.

In the prior art, source and drain regions of IGFETs are most frequently formed by either conventional diffusion or by ion implantations. In the case of conventional diffusion the source and drain regions are formed by diffusing an appropriate dopant impurity into selected areas of a semiconductor surface from an appropriate gas dopant source or from a predeposition source such as a doped semiconductor oxide layer or a doped polycrystalline semiconductor layer in contact with the surface. The impurity is then thermally driven to a desired depth below the surface. However, because the rate of transport of the dopant impurity into the surface by conventional diffusion is generally limited by the solid solubility of the impurity at the diffusion temperature, conventional diffusion followed later by a standard annealing step has the disadvantage of ordinarily not being able to provide an extremely shallow diffused region with a sufficiently high impurity level to provide the region with a low sheet resistance.

In the case of ion implantation, the source and drain regions are formed by bombarding selected areas of the semiconductor surface with an energetic beam of an appropriate ionized dopant impurity. Although ion implantation can provide extremely shallow impurity regions having very high impurity levels, such regions tend to have high sheet resistances owing to lattice damage in the implanted region caused by the ion implantation. Such lattice damage ordinarily results in a significant portion of the dopant impurity not being in proper substitutional lattice sites and a lowering of the carrier mobility in the implanted region. Consequently, ion implantation has the disadvantage in that a post-implantation annealing treatment for repairing the lattice damage is ordinarily required to lower the sheet resistance of an implanted region. Such an annealing treatment tends to cause the region to diffuse to an excessive depth. For that reason, ion implantation cannot ordinarily be used to provide low sheet rsistance source and drain regions of less than 2000 Angstroms in depth. Therefore, a need exists for a method for manufacturing IGFET devices which provides transistors having extremely shallow source and drain regions of low sheet resistance.

Presently, MOS transistors are preferably fabricated by a self-aligned gate technology in which a patterned gate electrode serves as a diffusion or implantation mask for the formation of the source and drain regions. In such transistors, the gate to source and drain overlap capacitances arise primarily from the lateral diffusion of the source and drain regions under the gate electrode. Since the extent of lateral diffusion of the source or drain region is proportional to the depth of such a region, using shallower source and drain regions generally contributes to reducing the overlap capacitances.

However, even in a self-aligned gate MOS technology, it is generally desirable to achieve further reductions in the overlap capacitances. Such reductions are preferably achieved by providing appropriate offsets between the edges of the gate electrode and the masks for the source and drain regions.

A prior art technique for providing such offsets is to reduce the width of the gate electrode by oxidation after the formation of the source and drain regions. However, this technique has the disadvantage in that the thermal treatment required for oxidizing the gate electrode drives the source and drain regions to excessive depths.

Moreover, it is known that the gate electrode can be oxidized before the implant. But in that case, as well as in the case where oxidation occurs after the formation of the source and drain regions, the length of the gate will be reduced, and the channel length will be variable. Also, in either case the surfaces of the source and drain regions are unavoidably displaced below the surface of the channel.

Another prior art technique for providing the above-described offset is to over-etch the gate electrode during patterning to form an overhanging photoresist layer above the gate electrode. The overhanging photoresist layer is then used, directly or indirectly, to mask the formation of the source and drain regions. However, this technique has the disadvantage in that the extent of the over-etching of the gate electrode is difficult to control, and the gate electrode acquires undesirable nonvertical sidewalls. Therefore, a need also exists for a method for manufacturing an IGFET which provides an offset between the gate electrode and the mask for forming the source and drain regions but which does not require oxidation or over-etching of the gate electrode.

In a typical self-aligned gate MOS technology, the gate electrodes of the transistor are provided by a layer of polycrystalline silicon (polysilicon). The polysilicon layer also provides a first level of interconnection for the transistors and other components of the device. A second level of interconnection is typically provided by a layer of an appropriate metal. Since the sheet resistance of even a heavily doped polysilicon layer is typically several orders of magnitude greater than that of the metal layer, it is desirable, for the purpose of increasing device speed, to reduce the sheet resistance of the polysilicon layer. A known technique for reducing the sheet resistance of the polysilicon layer is to form a layer of an appropriate metal silicide, such as tantalum silicide, on a surface of the polysilicon layer. In the prior art, the silicide layer is formed over the entire polysilicon layer prior to patterning. However, in some instances metal silicide layers are also required as contact layers for the source and drain regions. In those instances, it is desirable from the standpoint of reducing manufacturing cost to form the silicide layers for the polysilicon layer and the source and drain regions in the same processing step. Therefore, a need exists for a method for manufacturing an IGFET device which forms those silicide layers in a single processing step.

In some cases of practical importance, a need also exists for a relatively thin silicide layer for the source and drain regions (thereby establishing a prescribed low resistivity while maintaining shallow junctions) which layer is compatible with a relatively thick silicide layer (even lower resistivity) patterned to form part of the gate electrode.

SUMMARY OF THE INVENTION

The disadvantages of the prior art, as discussed above, are substantially removed by the present invention which is a method for manufacturing an insulated gate field effect transistor device including the following steps. First a lightly doped semiconductive body of a first conductivity type is prepared and a relatively thick field insulator layer is formed to cover a surface of the body except for one or more selected areas of the surface where transistors are to be formed. A relatively thin gate insulator layer is formed in each selected area covering a central portion thereof. A strip-like gate electrode is formed in each selected area overlying the gate insulator layer therein and leaving exposed first and second portions therein for the formation of source and drain regions. A source layer of an appropriate material is then formed to cover at least the first and second portions of each selected area, the source layer being doped with a suitable dopant impurity of a second conductivity type. The source layer is then heated at an appropriate temperature in the presence of an appropriate reactant to cause a reaction which consumes the source layer at a rate exceeding the rate at which the impurity in the source layer diffuses in the semiconductive body. The reaction produces a reaction product in which the impurity has a source-layer-material/reaction-product segregation coefficient which is significantly greater than unity. During the reaction, the impurity from the source layer is driven into the first and second portions of each selected area to form impurity regions therein. Electrical connections are formed to selected ones of those regions.

In an illustrative embodiment of the present invention, the semiconductive body is lightly doped p-type single crystalline silicon. A relatively thick layer of silicon dioxide is grown on a surface of the silicon body and anisotropically etched away from one or more selected areas. A relatively thin silicon dioxide layer is grown in each selected area. A layer of heavily doped n-type polysilicon is then deposited and patterned into strip-like gate electrodes each covering a central portion of a selected area. The polysilicon layer is also patterned to form interconnection paths outside of the selected areas. In each selected area, portions of the relatively thin silicon dioxide layer not covered by the gate electrode are removed by sputtering to expose the first and second portions of each selected area. The sputtering operation causes offset layer of silicon dioxide to be backsputtered onto the sidewalls of each gate electrode. A relatively thin source layer of polysilicon is then deposited to cover the entire surface and doped with arsenic. The composite structure is then heated in a steam ambient to completely oxidize the source layer at a rate exceeding the rate at which arsenic diffuses in the silicon body at the oxidation temperature. During the oxidation, arsenic from the source layer diffuses into the first and second portions of each selected area to form source and drain regions in the silicon body. Since the oxidation temperature is relatively low and complete oxidation of the relatively thin source layer in steam occurs rapidly, the source and drain regions that are formed are extremely shallow. In addition, during the oxidation, a silicon dioxide layer is produced which upon completion of the oxidation is in contact with the surface of the source and drain regions. Since arsenic has a silicon/silicon-dioxide segregation coefficient of approximately 800, nearly all of the arsenic in the source layer is accumulated at the silicon-dioxide/silicon interface allowing the surface concentration of arsenic in the source and drain regions to exceed the solid solubility of arsenic in silicon at the oxidation temperature. A short annealing treatment at a relatively low temperature in nitrogen is then used to activate substantially all of the arsenic in the source and drain regions. The oxide layer is then anisotropically etched to expose the surfaces of the source and drain regions, the gate electrodes and the interconnection paths. A relatively thin layer of cobalt is then deposited to cover the entire surface of the body. The composite structure is heated to cause a sintering reaction between the cobalt and portions of the silicon and the polysilicon in direct contact therewith. The unreacted portions of the cobalt layer are then removed by etching. A layer of phosphorus doped glass is deposited to cover the entire surface of the body and planarized. Contact windows to selected source and drain regions and polysilicon interconnection paths are then opened by anisotropic etching. An upper interconnection level made, for example, of aluminum with an appropriate known interface layer to prevent aluminum spiking of the sources and drains, is then deposited and patterned to form metal contacts to the selected source and drain regions and polysilicon interconnection paths and to provide metal interconnection paths.

DETAILED DESCRIPTION

Figure 1:
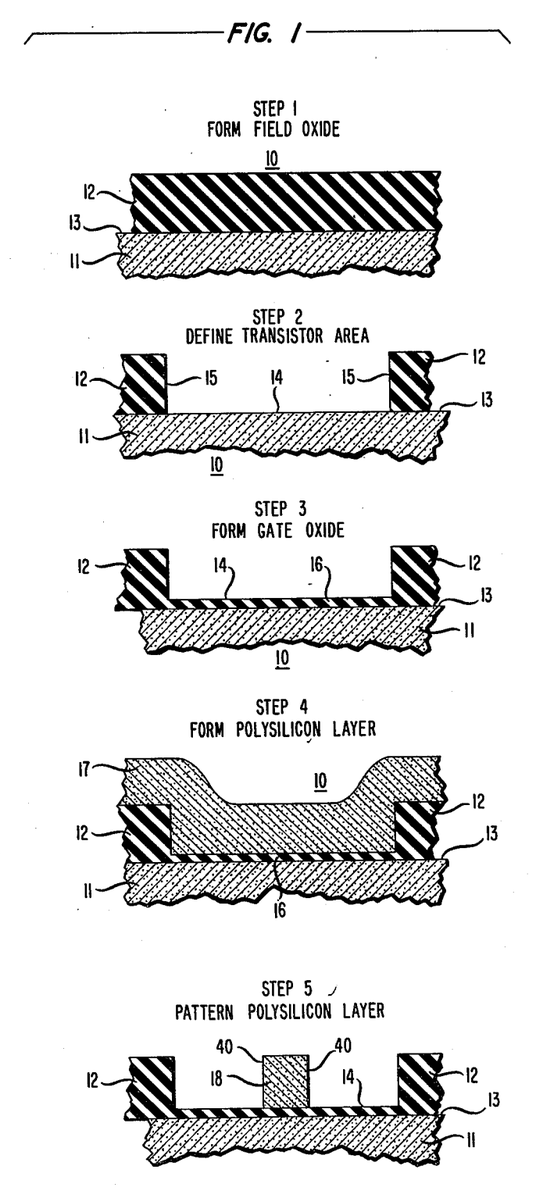
FIGS. 1 through 3 are respectively schematic cross-sectional views illustrating successive fabrication steps in the manufacture of an IGFET device according to alternative embodiments of the present invention.
Figure 2:
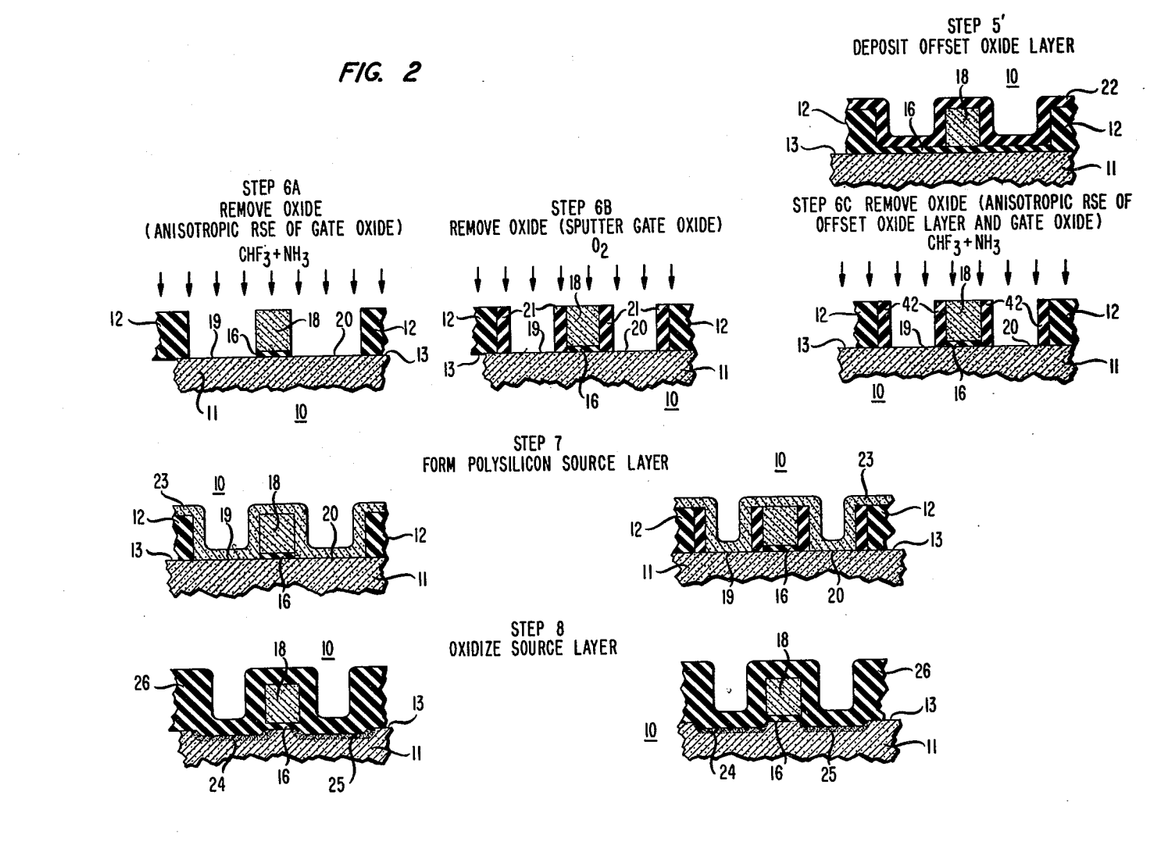
Figure 3:
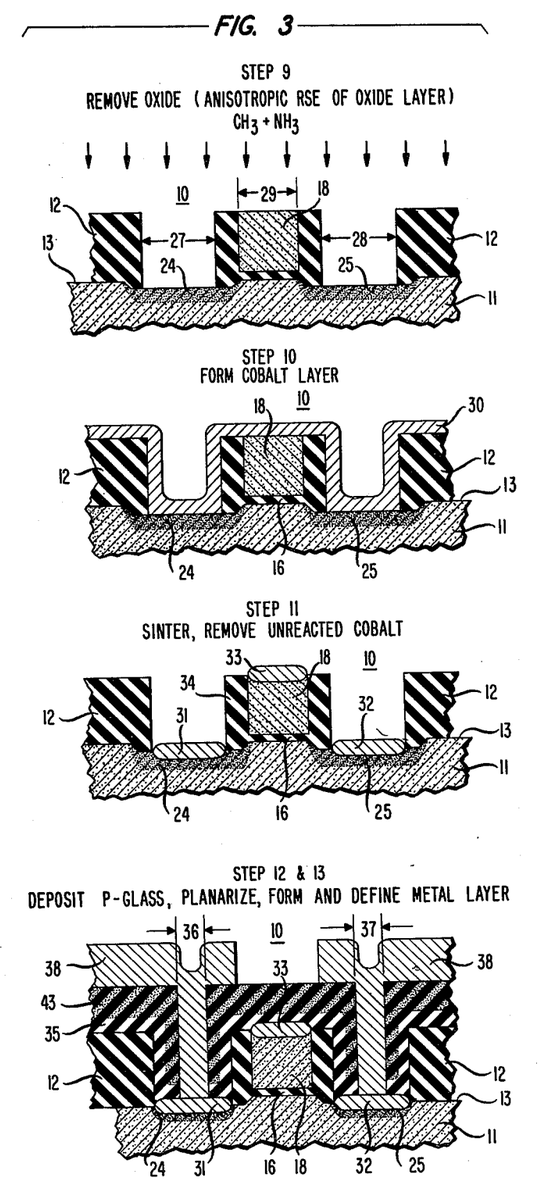

Referring now to FIGS. 1 through 3, there are shown schematic cross-sectional views representing a portion of a partially completed IGFET device 10 illustrating successive fabrication steps in the manufacture of the device according to alternative embodiments of the present invention. The same reference numerals are used throughout FIGS. 1 through 3 to denote like parts or regions of the device. As shown in FIG. 1, a 6–8 Ω-cm p-type (boron doped) single crystalline silicon body 11 is first prepared. The body may, for example, be a portion of a substrate wafer or a portion of an epitaxial layer grown on a substrate wafer. A silicon dioxide layer 12, approximately 3500 Angstroms thick, is thermally grown on a surface 13 of the body (step 1). Layer 12 will also be referred to as the field oxide layer. Using known lithographic and anisotropic etching techniques, the field oxide layer is removed from at least one selected area 14 of the surface in which a transistor is to be formed (step 2). There will typically be many such transistor areas in a device such as an integrated circuit. The field oxide is etched by reactive sputter etching (RSE) in $CHF_3+NH_3$ to produce nearly vertical sidewalls 15 at the boundaries of the transistor area. A silicon dioxide layer 16, approximately 250 Angstroms thick, is then thermally grown in each selected area (step 3). Layer 16 will also be referred to as the gate oxide layer. Although the present embodiment of the invention uses RSE of a nonselectively grown field oxide layer followed by a subsequent thermal oxidation to provide a gate oxide layer in each transistor area and a field oxide layer outside of the transistor areas, other techniques, such as the one known as selective oxidation, may also be used to provide similar oxide patterns.

A layer of polysilicon 17, approximately 3500 Angstroms thick, is formed by conventional chemical vapor deposition (CVD) over the entire surface of the body and doped with phosphorus to achieve a sheet resistance of approximately 30 ohms per square (step 4). (In some cases of practical importance, a metallic silicide layer is deposited on the polysilicon layer 17. This is not shown in the drawing.) The polysilicon layer and any overlying silicide is patterned by known lithographic and anisotropic etching techniques to define a gate electrode 18 in each transistor area and interconnection paths (not shown) outside of the transistor areas. The polysilicon layer is etched by RSE in $Cl_2$ to provide gate electrodes and interconnection paths with nearly vertical sidewalls 40. Each gate electrode 18 is formed in the shape of a strip extending across the transistor area 14 and covering a central portion thereof.

Turning now to FIG. 2, after patterning of the polysilicon layer, the gate oxide layer in each transistor area is partially removed to expose a first and a second portion 19 and 20 thereof in which the source and drain regions are to be formed. The gate oxide removal is masked by the gate electrode. Therefore, the remaining gate oxide 16 under the gate electrode also has substantially the same shape as the gate electrode. In one embodiment, the gate oxide is partially removed by RSE in $CHF_3+NH_3$ (step 6A). It is advantageous to perform the RSE at a relatively low power (e.g., less than 400 Watts) to minimize polymer deposition on the first and second portions 19 and 20. Such polymer deposition can increase the contact resistances of the source and drain regions which are subsequently formed in those portions.

In another and preferred embodiment, the uncovered gate oxide is removed by sputtering with oxygen ions at a power of approximately 500 Watts for approximately 30 minutes (step 6B). The sputtering of the gate oxide causes regions of silicon dioxide 21 to be deposited by backsputtering on the sidewalls of the gate electrode and the field oxide layer. The backsputtered oxide regions 21, which have a thickness in the range of 500 to 1000 Angstroms, provide offsets between the edges of the gate electrode and the mask for the source and drain regions. The use of backsputtering to form offset oxide layers is disclosed and claimed in copending U.S. patent application Ser. No. 328,368 (E. Kinsbron and W. T. Lynch). As discussed above, such offsets are useful for reducing the gate to source and drain overlap capacitances. After the sputtering, the exposed first and second portions of surface 19 and 20 are preferably cleaned in a 100:1 solution of HF for approximately one minute. Such cleaning also removes approximately 100 Angstroms of the backsputtered oxide regions 21.

In still another embodiment, prior to the removal of the gate oxide, a layer of silicon dioxide 22 approximately 700 Angstroms thick is formed to cover substantially the entire surface of the body (step 5'). Oxide layer 22 is advantageously formed by CFD from a tetraethyl orthosilicate (TEOS) source. The composite structure 10 is then anisotropicaally etched with RSE in $CHF_3+NH_3$ to expose a second portion 19 and 20 of each transistor area while leaving oxide regions 42 on the vertical sidewalls of the field oxide and the gate electrode (step 6C). Once again, the RSE should be performed at low power (e.g., less than 400 Watts) to avoid excessive polymer deposition. The oxide regions 42 which remain on the sidewalls of the gate electrode provide offsets between the edges of the gate electrode and the mask for the source and drain regions. It will be noted that in order to use anisotropic etching to provide the offset oxide regions 42, the gate electrode 18 must be formed with substantially vertical sidewalls.

After removal of the gate oxide over the first and second portions of each selected area, the exposed portions are cleaned in a 100:1 solution of HF and a source layer 23 of polysilicon, approximately 500 Angstroms thick, is formed by CVD over the entire surface of the body (step 7). The source layer is doped by ion implantation with arsenic to a concentration of approximately $1 \times 10^{21}\,cm^{-3}$. Although the disclosed embodiments use ion implantation to dope the source layer, other methods of doping the source layer, such as in situ doping during deposition of the source layer or conventional diffusion after deposition, may be substituted for the ion implantation. However, if ion implantation is used, the energy of the implant must be such that the ions do not penetrate through the source layer. An energy of 30 KeV was found to be satisfactory for implanting a 500 Angstrom thick polysilicon layer with arsenic. No annealing of the source layer is necessary after the implant.

The composite structure 10 is then heated at a temperature of approximately 900 degrees C. in the presence of steam (water vapor) to effect oxidation of the polysilicon source layer (step 8). The source layer is permitted to be completely consumed by oxidation in approximately 20 minutes. During that time, the arsenic in the source layer diffuses into the silicon body to form source and drain regions 24 and 25 which extend approximately 400 Angstroms below the surface of the body. The oxidation time may vary depending on the method of doping. For example, under the same conditions complete oxidation of an in situ doped source layer of the same thickness requires approximately 40 minutes.

The oxidation of the source layer produces a layer of silicon dioxide 26 which is in contact with the source and drain regions upon completion of the oxidation. Silicon dioxide has a tendency to reject arsenic, which preferentially segregates in the unoxidized portion of the polysilicon. The ratio of the equilibrium concentration of an impurity in the silicon to that in the silicon dioxide is denoted by the term silicon/silicon-dioxide segregation coefficient and is defined as $$m = \frac{\text{Equilibrium Concentration of Impurity in Silicon}}{\text{Equilibrium Concentration of Impurity in SiO}_2}$$

Since arsenic has a silicon/silicon-dioxide segregation coefficient of approximately 800, nearly all of the arsenic in the polysilicon source layer is segregated in the unoxidized portion of the layer during oxidation. Upon completion of the oxidation nearly all of the arsenic in the region of the polysilicon layer above the first and second portions of the transistor area will have been driven into the source and drain regions 24 and 25.

Because the oxidation rate of the polysilicon layer at 900 degrees C. in steam is greater than the rate at which arsenic diffuses in the polysilicon layer and the body at that temperature, there is an accumulation of arsenic at the silicon-dioxide/silicon which increases with oxidation time. To a lesser extent, there is also an accumulation of arsenic at the polysilicon/single-crystal-silicon interface due to grain boundary diffusion and segregation of the arsenic. After the polysilicon layer is completely oxidized, the arsenic concentrations at the surfaces of the source and drain regions are nearly twice the solid solubility of arsenic in silicon at 900 degrees C. Therefore, the oxidation of the arsenic doped polysilicon source layer provides extremely shallow source and drain regions having considerably higher surface concentrations of arsenic than that which can be provided by conventional diffusion. Steam oxidation of the polysilicon source layer may also be performed at other temperatures, advantageously in the range of 800 to 950 degrees C. The formation of surface dopant layers by oxidation of a source layer is disclosed and claimed in copending U.S. patent application Ser. No. 352,519 (E. Kinsbron Case 5).

It should be noted that the source layer does not oxidize uniformly. Owing to the negligibly small diffusivity of arsenic in silicon dioxide as compared with that in silicon, the accumulation of arsenic at the silicon-dioxide/silicon interface is greater in the regions of the polysilicon layer above the field oxide layer 12 than in the regions above the exposed areas of the silicon body 19 and 20. Since the oxidation raate of silicon decreases as the arsenic concentration therein increases, it is necessary to "over-oxidize" the regions of the source layer above the exposed areas and consume approximately 200 Angstroms of the body in those areas in order to obtain complete oxidation of the regions of the source layer above the field oxide layer. Over-oxidation may be avoided by forming the source layer to cover only each transistor area or by doping only the region of the source layer above each transistor area.

After oxidation of the source layer, the source and drain regions 24 and 25 have relatively high sheet resistances of approximately 140 ohms per square, owing to a significant portion of the arsenic impurities in those regions not occupying proper substitutional lattice sites. However, the oxidation of the source layer causes relatively little lattice damage in those regions. Therefore, a relatively short annealing treatment of approximately 30 minutes at approximately 950 degrees C. in nitrogen is used to activate substantially all the arsenic in the source and drain regions. A separate annealing step is not required if subsequent processing steps include heat treatments sufficient for activating the arsenic.

Turning now to FIG. 3, the silicon dioxide layer resulting from the oxidation of the source layer is anisotropically etched with RSE in $CHF_3 + NH_3$ to expose surface portions 27 and 28 of the source and drain areas 24 and 25, respectively (step 9). Also exposed by the anisotropic etching is the top surface 29 of the gate electrode 18 in each transistor area and the top surfaces of the polysilicon interconnection paths (not shown). A layer 30 of cobalt approximately 200 Angstroms thick is formed by conventional sputtering techniques over the entire surface of the body (step 10). The composite structure 10 is then heated at approximately 450 degrees C. for approximately 90 minutes to initiate a sintering reaction between the cobalt layer and the silicon and polysilicon surfaces in contact therewith. The unreacted cobalt is then removed by etching in a 5:3:1:1 volume mixture of $C_2H_4O_3$, $HNO_3$, $H_3PO_4$ and $H_2SO_4$. The composite structure is heated again, this time in an oxidizing ambient, at approximately 900 degrees C. for approximately 30 minutes to continue the sintering reaction to produce cobalt disilicide layers 31, 32 and 33 over the source and drain regions and the gate electrode, respectively, in each transistor area. The formation of cobalt disilicide layers is disclosed and claimed in U.S. patent application Ser. No. 296,914 (H. J. Levinstein, S. P. Murarka and A. K. Sinha now U.S. Pat. No. 4,378,628.

Each cobalt silicide layer is approximately 700 Angstroms thick. The sintering reaction also produces cobalt silicide layers over the polysilicon interconnection paths (not shown). Thus, the contact silicide layers for the source and drain regions and the resistance lowering silicide layers for the polysilicon gate electrodes and interconnection paths are formed in the same processing step. It will be noted that the simultaneous formation of the silicide layers is made possible by the formation of the silicon-dioxide layer 34 on the sidewalls of the gate electrodes and on the polysilicon interconnection paths (not shown) by the oxidation of the source layer and the anisotropic etching of the resulting silicon dioxide layer.

The combined heating of the annealing treatment and the sintering of the cobalt causes the source and drain regions 24 and 25 to diffuse to a depth of approximately 1000 Angstroms and acquire sheet resistances of less than 7 ohms per square. These regions also diffuse laterally by approximately 700 Angstroms causing the gate to overlap these regions. The overlap is virtually eliminated in those embodiments where offset oxide regions of at least 700 Angstroms in thickness are formed on the sidewalls of the gate electrode by one of the above-described techniques prior to the deposition of the source layer. However, even where no offset oxide layer is used, the overlap between the gate electrode and the source or drain region is less than the extent of the lateral diffusion of the source and drain regions if the source layer is doped by ion implantation. Since the energy of the implant is adjusted so that the ions do not penetrate the thickness of the source layer, the vertical regions of the source layer adjacent to the sidewalls of the gate electrode are not implanted. Consequently, the diffusion of dopants from the source layer is offset from the edges of the gate electrode.

After formation of the silicide layers, successive layers of undoped and phosphorus doped silicon dioxide glass 35 and 43, respectively, are deposited by CVD at approximately 630 degrees C. from a TEOS and phosphine source. The phosphorus doped glass layer is planarized by a known plasma technique, and contact windows 36 and 37 to selected source and drain contact layers 31 and 32, respectively, are opened by conventional lithography and anisotropic RSE with CHF$_3$ (step 12). In the same processing step contact windows to selected polysilicon interconnection paths (not shown) are also formed. A layer of aluminum 38 is then formed by a conventional deposition technique and patterned to form metal contacts to the selected source and drain regions and polysilicon interconnection paths and to form metal and interconnection paths. The aluminum layer is patterned by conventional lithography and anisotropic etching with RSE in BCl$_3$+Cl$_2$ (step 13).

Although the preferred embodiment of the present invention uses arsenic for forming the source and drain regions by oxidation of an arsenic doped polysilicon source layer, it is contemplated that other suitable species of impurities as well as other source-layer materials may be substituted. For example, other donor impurities for silicon, such as phosphorus and antimony, have silicon/silicon-dioxide segregation coefficients which are significantly greater than unity and may therefore be substituted for arsenic for forming N-type source and drain regions in silicon. However, arsenic has the advantages of a relatively high segregation coefficient and a relatively low diffusivity. For the formation of extremely shallow source and drain regions having high surface concentrations, it is advantageous to select an impurity which has the highest segregation coefficient and the lowest diffusivity.

Given a particular species of impurities and a particular source-layer material, the depth and surface concentration of the source and drain regions formed by oxidation of the source layer is a function of the thickness and impurity concentration of the source layer and the rate of oxidation. The conditions of the oxidation, i.e., temperature and ambient, should be selected to provide an oxidation rate which exceeds the rate at which the impurities diffuse in the silicon body at the oxidation temperature and which provide for complete oxidation of the source layer in a time not longer than that required for the impurity in the source layer to diffuse into the body to form source and drain regions of desired depths. If the device is to be subjected to further heating treatments after oxidation, such as annealing or silicide formation, the extent of further diffusion of the source and drain regions during such heating treatments should be taken into account. Steam is advantageously used over other oxidizing ambients for silicon, since a steam ambient provides a faster oxidation rate at a given temperature.

Although the present invention provides particular advantages for the formation of IGFETs with extremely shallow source and drain regions, it is also applicable to the formation of IGFETs with deeper source and drain regions by making appropriate changes in the thickness of the source layer and the conditions of oxidation.

If ion implantation is used to dope the source layer, it may be advantageous, from the standpoint of obtaining shallower source and drain regions to implant only a surface portion of the source layer adjacent to the target surface. During oxidation of such a nonuniformly implanted source layer, the implanted impurity must first diffuse through the unimplanted portion of the source layer before entering the bulk region. Therefore, for a given oxidation rate the use of such a nonuniformly implanted source layer would provide shallower source and drain regions than a uniformly doped source layer.

Although in the preferred embodiment of the present invention, the partially completed device is heated in an oxidizing ambient to cause oxidation of the source layer, it is also contemplated that another appropriate reactant may be substituted to cause another reaction that would consume the source layer at a rate exceeding the rate at which the impurity in the source layer diffuses in the body and that would provide a reaction product in which the source-layer-material/reaction-product segregation coefficient is significantly greater than unity. For example, a polysilicon source layer doped with boron may be heated at an appropriate temperature in the presence of platinum to cause a sintering reaction which consumes the source layer at a rate exceeding the rate at which boron diffuses in silicon. The reaction replaces the polysilicon layer with a layer of platinum silicide, and boron has a platinum-silicide/silicon segregation coefficient which is significantly greater than unity. The platinum may be deposited in a layer over the polysilicon layer or may be sputter deposited simultaneously with the deposition of the polysilicon layer.

As stated earlier above, the need may arise in practice for relatively thin silicide layers overlying the source and drain regions and a relatively thick silicide layer overlying the polysilicon gate. In accordance with the procedures described herein, this can conveniently be achieved in at least two different ways. First, a relatively thick layer of a silicide may be formed on top of the polysilicon layer and then patterned with the polysilicon to form the gate structure. Or, after defining the polysilicon gate, a relatively thick layer of a silicide may be selectively formed on the polysilicon gate. In either case, the doped polysilicon may then be deposited and oxidized over the silicide-polysilicon structure. Further processing is then carried out as described in detail above.

It will be understood by those skilled in the art that the foregoing and other modifications and substitutions may be made to the described embodiment without departing from the spirit and scope of the present invention. For example, the source layer may be of a single crystal material, such as an epitaxially grown material, instead of a polycrystalline material, and the source layer material may be different from that of the body.

What is claimed is:

1. A method for manufacturing a semiconductor device comprising the steps of:

preparing a semiconductive body of a first conductivity type and lightly doped;

forming on a surface of the body a relatively thick insulating layer covering the surface except for one or more selected areas thereof;

forming a relatively thin strip-like insulating layer covering a central portion of each selected area and leaving exposed a first and second region therein;

forming a strip-like first conducting layer in each selected area overlying the relatively thin insulating layer therein;

characterized in that there are included the steps of:

forming a source layer of an appropriate material covering at least the first and second regions in each selected area, the source layer containing a suitable dopant impurity of a second conductivity type;

heating the source layer at an appropriate temperature in the presence of an appropriate reactant to cause a reaction which consumes the source layer at a rate exceeding the rate at which the impurity diffuses in the body, the reaction producing a reaction product and the impurity having a source-layer-material/reaction-product segregation coefficient significantly greater than unity, so as to form a second-conductivity-type impurity concentration at the interface between the reaction product and the body that is substantially larger than the initial impurity concentration in the source layer, which impurity concentration at the interface exceeds the solid solubility of the impurity in the body;

and forming electrical connections to selected ones of the first and second regions in each selected area.

2. A method as recited in claim 1 further characterized in that the reactant is an appropriate oxidizing ambient, the reaction is oxidation, the reaction product is an oxide of the source layer material and the source-layer-material/reaction-product segregation coefficient is the source-layer-material/source-layer-material-oxide segregation coefficient.

3. A method as recited in claim 2 in which said device comprises an insulated gate field effect transistor device and further characterized in that the thickness of the source layer, the impurity in the source layer, the concentration thereof, the temperature and ambient of the oxidation are selected to provide source and drain regions of the second conductivity type having desired depths and surface concentrations in the first and second regions of each selected area.

4. A method as recited in claim 3 wherein the body is single crystalline silicon, further characterized in that the source layer is polycrystalline silicon, the source-layer-material oxide is silicon dioxide and the source-layer-material/source-layer-material-oxide segregation coefficient is the silicon/silicon-dioxide segregation coefficient.

5. A method as recited in claim 4 wherein the strip-like insulating layer and the strip-like first conducting layer are formed by thermally growing a relatively thin silicon dioxide layer in each selected area, depositing an appropriately doped polysilicon layer covering substantially the entire surface of the body and overlying the relatively thin silicon dioxide layer in each selected area, patterning the polysilicon layer into one or more strip-like layers each covering a central portion of a respective selected area and one or more interconnection paths outside of the selected areas, removing portions of the relatively thin silicon dioxide layer not covered by the strip-like polysilicon layer in each selected area, and further characterized in that prior to forming the source layer, offset oxide regions are formed on the sidewalls of the strip-like polysilicon layer in each selected area.

6. A method as recited in claim 5 further characterized in that the portions of the relatively thin silicon dioxide layer not covered by a strip-like polysilicon layer in each selected area are removed by sputtering with appropriate ions under conditions which cause silicon dioxide to be backsputtered onto the sidewalls of the strip-like polysilicon layer, and the offset oxide regions are formed by such backsputtering.

7. A method as recited in claim 5 further characterized in that each strip-like polysilicon layer is patterned to have substantially vertical sidewalls, a relatively thin second silicon dioxide layer is formed covering at least each selected area including the strip-like polysilicon layer therein, and the second silicon dioxide layer is partially removed by anisotropic etching leaving portions thereof adjacent the sidewalls of the strip-like polysilicon layer in each selected area.

8. A method as in claim 5 wherein, subsequent to the formation of said offset oxide regions on the sidewalls of the strip-like polysilicon layer, the aforespecified source layer formed overlying the strip-like polysilicon layer in each selected area and the polysilicon interconnection paths is oxidized and then patterned to expose portions of the first and second regions and a surface of each strip-like polysilicon layer and interconnection path while at the same time leaving portions of the oxidized source layer to add further thickness to the offset oxide regions on the sidewalls of the strip-like polysilicon layer.

9. A method as in claim 4 wherein the strip-like insulating layer and the strip-like first conducting layer are made by forming a relatively thin silicon dioxide layer in each selected area, forming an appropriately doped polysilicon layer covering substantially the entire surface of the body and overlying the relatively thin silicon dioxide layer in each selected area, patterning the polysilicon layer into one or more strip-like layers each covering a central portion of a respective selected area and one or more interconnection paths outside of the selected area, removing portions of the relatively thin silicon dioxide layer not covered by the strip-like polysilicon layer in each selected area, forming the source layer to cover substantially the entire surface of the body overlying the strip-like polysilicon layer in each selected area and the polysilicon interconnection paths, oxidizing the source layer to form a silicon dioxide layer, and then anisotropically etching the silicon dioxide layer produced by the oxidation reaction to expose portions of the first and second regions and a surface of each strip-like polysilicon layer and interconnection path and to leave portions of said last-mentioned silicon dioxide layer on the sidewalls of the strip-like polysilicon layer to serve an offset oxide regions.

10. A method as in claim 9 or 8 wherein a relatively thin layer of an appropriate metal is formed covering substantially the entire surface of the body, the metal layer and the body are heated to cause a sintering reaction between portions of the metal layer and the exposed portions of the surface of the body and the exposed surface of each strip-like polysilicon layer and interconnection path to form metal-silicide layers thereon, the unreacted portions of the metal layer are removed, one or more glass layers covering substantially the entire surface of the body are formed, contact windows in the glass layers are formed to expose portions of selected ones of the metal-silicide layers, a second conducting layer is formed covering substantially the entire surface of the body, and the second conducting layer is patterned to form contacts to the exposed portions of selected metal-silicide layers.

11. A method as recited in claims 4, 6 or 7 further characterized in that the source layer is formed to cover substantially the entire surface of the body, overlying the strip-like polysilicon layer in each selected area and the polysilicon interconnection paths, the oxidation reaction consumes substantially the entire source layer, the silicon dioxide layer produced by the oxidation reaction is anisotropically etched to expose at least portions of the first and second regions and a surface of each strip-like polysilicon layer and interconnection path, a relatively thin layer of an appropriate metal is formed covering substantially the entire surface of the body, the metal layer and the body are heated to cause a sintering reaction between portions of the metal layer and the exposed portions of the surface of the body and the exposed surface of each strip-like polysilicon layer and interconnection path to form metal-silicide layers thereon, the unreacted portions of the metal layer are removed, one or more glass layers covering substantially the entire surface of the body are formed, contact windows in the glass layers are formed to expose portions of selected ones of the metal-silicide layers, a second conducting layer is formed covering substantially the entire surface of the body, and the second conducting layer is patterned to form contacts to the exposed portions of the selected metal-silicide layers and second interconnecting paths.

12. A method as recited in claim 11 further characterized in that the source layer is formed by chemical vapor deposition of polycrystalline silicon and at least a portion thereof being doped in situ.

13. A method as recited in claim 11 further characterized in that the source layer is formed by chemical vapor deposition of undoped polycrystalline silicon and doped by conventional diffusion after deposition.

14. A method as recited in claim 11 further characterized in that the source layer is formed by chemical vapor deposition of undoped polycrystalline silicon and doped by ion implantation after deposition.

15. A method as recited in claim 14 further characterized in that only a surface portion of the source layer is doped by ion implantation.

16. A method for manufacturing a semiconductor device comprising the steps of:

preparing a semiconductive body of a first conductivity type, forming on a surface of the body a relatively thick insulating layer covering the surface except for one or more selected areas thereof, forming a relatively thin strip-like insulating layer covering only a central portion of each selected area and leaving exposed a first and second region therein, forming a strip-like first conducting layer in each selected area overlying the relatively thin insulating layer therein, forming on the surface of said body a source layer of an appropriate material, the source layer containing a suitable dopant impurity of a second conductivity type, heating the source layer at an appropriate temperature in the presence of an appropriate reactant to cause a reaction which consumes the source layer at a rate exceeding the rate at which the impurity diffuses in the body, the reaction producing a reaction product and the impurity having a source-layer-material/reaction-product segregation coefficient significantly greater than unity, so as to form a second-conductivity-type impurity concentration at the interface between the reaction product and the body that is substantially larger than the initial impurity concentration in the source layer, which impurity concentration at the interface exceeds the solid solubility of the impurity in the body, and patterning the reaction product to expose surface portions of the first and second regions and a surface of the first conducting layer while leaving portions of the reaction product on the sides of the strip-like first conducting layer to serve as offset regions.

17. A method as in claim 16 further comprising the subsequent steps of forming a relatively thin layer of an appropriate metal covering substantially the entire surface of the body, heating the metal and the body to cause a sintering reaction between portions of the metal layer and the exposed portions of the surface of the body and the exposed surface of each strip-like first conducting layer to form metal-silicide layers thereon, and removing the unreacted portions of the metal layer.

18. A method as in claim 17 further comprising forming an insulating layer covering substantially the entire surface of the body, forming contact windows in said insulating layer overlying selected portions of said metal-silicide layers, and forming a conductive pattern on said body and in said contact windows.

* * * * *

UNITED STATES PATENT AND TRADEMARK OFFICE
CERTIFICATE OF CORRECTION

PATENT NO. : 4,471,524

DATED : September 18, 1984

INVENTOR(S) : Eliezer Kinsbron and William T. Lynch

It is certified that error appears in the above-identified patent and that said Letters Patent is hereby corrected as shown below:

Column 2, line 25, "rsistance" should read --resistance--. Column 6, line 31, "CFD" should read --CVD--. Column 7, line 62, "raate" should read --rate--.

Column 12, line 58, "an" should read --as--.

Signed and Sealed this

Thirtieth Day of July 1985

[SEAL]

Attest:

DONALD J. QUIGG

Attesting Officer     Acting Commissioner of Patents and Trademarks